(12) United States Patent  
Umeoka et al.

(10) Patent No.: US 7,735,219 B2  
(45) Date of Patent: Jun. 15, 2010

(54) METHOD FOR MACHINING A BOARD

(75) Inventors: Kazunori Umeoka, Osaka (JP); Toru Fujioka, Osaka (JP); Hideyuki Andou, Osaka (JP); Yuzo Okudaira, Osaka (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 11/785,649

(22) Filed: Apr. 19, 2007

(65) Prior Publication Data

US 2007/0193680 A1 Aug. 23, 2007

Related U.S. Application Data

(63) Continuation of application No. 10/960,105, filed on Oct. 8, 2004, now abandoned.

(30) Foreign Application Priority Data

Feb. 5, 2004 (JP) ............................. 2004-029652

(51) Int. Cl.  
*H05K 3/36* (2006.01)

(52) U.S. Cl. .................. 29/830; 29/26 A; 29/26 R; 156/275.5; 408/1 R; 408/31

(58) Field of Classification Search .................. 29/830, 29/26 A, 26 R; 83/658; 156/275.5; 408/1 R, 408/241 R, 31, 87, 95  
See application file for complete search history.

(56) References Cited

U.S. PATENT DOCUMENTS 5,492,756 A 2/1996 Seale et al.

| 6,197,414 | B1 | 3/2001 | Kawai et al. |
| 6,200,074 | B1 * | 3/2001 | Miller et al. ................ 408/1 R |
| 7,045,027 | B2 | 5/2006 | Okuzawa et al. |
| 2004/0187998 | A1 | 9/2004 | Okuzawa et al. |
| 2004/0224140 | A1 | 11/2004 | Ohnishi et al. |

FOREIGN PATENT DOCUMENTS

| JP | 04-109137 | 9/1992 |
| JP | 11-333986 | 7/1999 |
| JP | 248610 | 3/2002 |

* cited by examiner

Primary Examiner—Thiem Phan  
(74) Attorney, Agent, or Firm—Bacon & Thomas, PLLC

(57) ABSTRACT

A method for machining a board includes forming a backup board, supporting the board by the backup board and machining the board while the board is supported by the backup board. The backup board has a fibrous layer and a surface layer formed on one side of the fibrous layer, the surface layer being in contact with the board during said supporting machining the board. The backup board is formed by: forming an impregnated fibrous mat by impregnating a thermosetting adhesive into a fibrous mat of the kenaf fibers, the kenaf fibers; forming the fibrous layer having a density of about 600-900 kg/m³ by curing the impregnated fibrous mat; forming a resin paper by impregnating a thermosetting resin into a paper; and forming the surface layer on said one side of the fibrous layer by curing the resin paper.

20 Claims, 3 Drawing Sheets

METHOD FOR MACHINING A BOARD

CROSS REFERENCE TO RELATED APPLICATION

This application is a continuation application of U.S. application Ser. No. 10/960,105, filed Oct. 8, 2004, now abandoned, which claims the benefit of JAPAN application 2004-029652, filed Jan. 5, 2004.

BACKGROUND OF THE INVENTION

When drilling and/or routering a printed circuit board (PCT), a backup board is used to support the PCB either by applying it to the rear side of the PCB or by sandwiching the PCB with the backup boards. By using the backup board, a copper film of the PCB can be prevented from burring off during a drilling and/or routering process.

Conventionally, a backup board has been of a wooden board used for construction purpose, such as a particle board. However, a higher precision is required in processing the PCB these days and burrs on a copper film need to be reduced even more.

To lower the occurrence of burrs on a copper film, therefore, the backup board surface needs to be harder and smoother. A laminated resin plate made by processing a pile of prepregs of certain thickness under heat and pressure may serve this purpose due to its hard and smooth surface properties, a prepreg being made by impregnating paper with a thermosetting resin such as phenolic resin (see Japanese Patent Laid-open Application No. H08-118296).

However, the laminated resin plate has a poor workability due to its heavy weight with its specific gravity of about 1.4. Furthermore, due to the overall hardness of the laminated resin plate, the bits of a drill and/or router tend to be easily worn out. Another problem associated with using the laminated resin plate is that a paper-based resin plate may easily develop warps with a dimensional change caused by, e.g., moisture absorption. When the backup board develops warps in this manner, it may not support the PCB properly, thus failing to keep the level of burrs below an allowable limit.

SUMMARY OF THE INVENTION

It is, therefore, primary object of the present invention to provide a backup board for use in a machining process which is of a lightweight and enhanced workability and causes less abrasion on the bits of a machining tool without sacrificing its function as a burr keeper.

In accordance with the present invention, there is provided a backup board for use in a machining process, including a fibrous layer, at least one side thereof being provided with a surface layer adhered and laminated thereon, wherein the surface layer is of a cured fiber sheet (paper) impregnated with a thermosetting resin and the fibrous layer has a density of about 600~900 kg/m$^3$ and includes kenaf fibers adhered together by impregnating a thermosetting adhesive into a fibrous mat of the kenaf fibers, the kenaf fibers having an average length of about 10~200 mm and an average diameter of about 10~300 μm.

The backup board for use in a machining process in accordance with the present invention includes a core of light weighted fibrous layer, which has a density of about 600~900 kg/m$^3$, and a surface lamination of hard and smooth surface, incorporating the benefits of a large reduction in the material weight, enhanced workability and reduction in the abrasion of the bits of machining tools. Moreover, as the fibrous layer containing the kenaf fibers is dimensionally stable when it absorbs moisture, warps in the backup board rarely develop, thereby providing a secured support to the PCB during the machining process.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Preferred embodiments of the present invention will now be described with reference to FIGS. 1~4B.

A fibrous layer 11, employed as a core in the backup board for use in a machining process in accordance with the present invention, is preferably prepared by bonding fiberized kenafs (Annual plant, Malvaceae family) with a thermosetting adhesive.

Figure 2A:
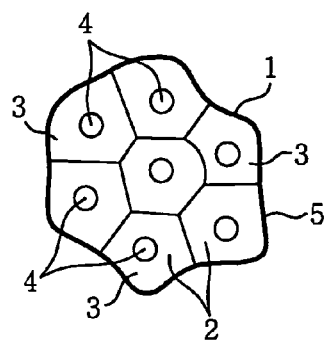
FIG. 2A describes a schematic diagram of a cross-sectional view of the kenaf fiber.

The kenaf fiber is obtained by mechanically fiberizing a long fiber bundle (width: about 1~2 cm; length: about 2~4 m) obtained from a bast (bark) of a kenaf stem. The kenaf fibers are fiberized until their average length reaches preferably a length of about 10~200 mm, more preferably about 15~80 mm, and their average diameter reaches a size of preferably about 10~300 μm, more preferably about 70~150 μm. These fiberized kenaf fibers are used in manufacturing the fibrous layer 11. FIG. 2A shows a schematic diagram of a microscopic cross-sectional view of a kenaf fiber 1. A plurality of monofibers 2 having a diameter of about 10~30 μm are bundled to constitute the single kenaf fiber 1, each of the monofibers 2 having a cellular wall 3 around the center to form a conduit 4 therein. Reference number 5 indicates a fiber surface.

If an average length of the kenaf fibers is below the preferred range specified above, the kenaf fibers may possess a less integrity than what is needed for a desirable solidity in the resulting fibrous layer 11. On the other hand, if an average length of the kenaf fibers is above the preferred range, the kenaf fibers may form a fibrous mat (to be described later) of an irregular structure, which, when processed under heat and pressure, may develop an uneven density distribution in the fibrous layer 11 and resulting weak spots. If an average diameter of the kenaf fibers is below the preferred range specified above, a dimensional stability of the fibrous layer 11 is at risk when it absorbs moisture because a reduced space between the kenaf fibers would lower the permeability, although it may be true that the fibrous layer 11 gets solider due to the increased entanglements between the kenaf fibers as a result of increased contact points. On the other hand, if an average diameter of the kenaf fibers is above the preferred range, the kenaf fibers, like oil palm fibers, get too thick to constitute the fibrous layer 11 of an appropriate strength, even though its dimensional stability may be secured with high permeability.

A curing process following the impregnation of the fibrous mat made of the kenaf fibers with a thermosetting adhesive completes the manufacture of the fibrous layer 11. Illustration of the specific manufacturing steps can be explained as follows. First, the fiberized kenaf fibers are piled up. Next, a needle punching is conducted as needed on the piled fiberized kenafs to wind them into the fibrous mat. A thermosetting adhesive which may be employed in the present invention can be an adhesive selected from the group consisting of a phenolic resin adhesive, a urea resin adhesive, a melamine resin adhesive and a melamine-urea cocondensed resin adhesive; however, it is not limited thereto.

Next, the fibrous mat so prepared is dipped in thermosetting adhesive for impregnation before it is squeezed into a squeeze roller wherein the thermosetting adhesive content is adjusted to a certain level. It is preferable that the amount of the thermosetting adhesive is adjusted to a range of about 20~30 weight % of the fibrous mat on a dry basis. Before impregnated with the thermosetting resin, the fibrous mat may be dried to a point where its water content is about 25 weight % or less. The fibrous mat need not be dried to have the water content below 5 weight %; however, there is no specific limit placed on the minimum water content. If dried before the impregnation step, the kenaf fibers in the fibrous mat would be more amenable to the resin component infiltration, which will secure a dimensional stability in the resulting fibrous layer 11.

After the impregnation step, the fibrous mat is dried until its water content is lowered to a certain level. Drying is conducted either by blowing hot or room temperature air to the fibrous mat or by placing the fibrous mat in a furnace. It is preferable that the water content of the fibrous mat is lowered to about 15 weight % or less. Next, the thermosetting adhesive within the fibrous mat is cured under heat and pressure to form the fibrous layer 11. The curing is preferably conducted at a temperature of about 120° C.~190° C. and under a pressure of about 1~4 MPa. Curing time is adjusted in accordance with the plate thickness and heating temperature.

In the present invention, the density of the fibrous layer 11 is preferably about 600~900 kg/m$^3$ and more preferably about 700~850 kg/m$^3$. To control the density, either the areal weight of the fibrous mat or the amount of the thermosetting adhesive used in the fibrous layer 11 is adjusted. If the density of the fibrous layer 11 is below the preferred range, the kenaf fibers may develop less entanglements than needed for a desirable solidity in the resulting fibrous layer 11. Such fibrous layer 11 would be too weak to be used as a core in the backup board. On the other hand, if the density of the fibrous layer 11 is above the preferred range, the resulting backup board gets so heavy that the benefit of enhanced workability is lost even though it is true that the fibrous layer 11 gets solid with a decreased space and increased entanglements between the kenaf fibers.

The fibrous layer 11 is preferably of about 1.0~1.5 mm in thickness. If the thickness of the fibrous layer 11 is less than 1.0 mm, the strength of the fibrous layer 11 may not be sufficient for using as a core of the backup board. On the other hand, if the thickness of the fibrous layer 11 is more than 1.5 mm, the resulting backup board gets so heavy that the benefit of enhanced workability may be gone.

In the present invention, standard deviation of the length of the kenaf fibers is preferably about 20 mm or less and that of the diameter is preferably about 50 μm or less. If the length or diameter of each kenaf fiber varies in a wide range, the characteristics of the present invention described so far may not be secured. However, if the kenaf fiber size is controlled so that the standard deviation of the length is about 20 mm or less and that of the diameter is about 50 μm or less, the fibrous layer 11 with consistent characteristics may be easily obtained. Needless to say, the less the standard deviation of the length and diameter of the kenaf fiber is, the more desirable the resulting product will be.

In the present invention, the thermosetting adhesive used to bond the kenaf fibers can be one of those previously described but, preferably, a phenolic resin adhesive. More preferably, a resol-type phenolic resin adhesive is used as the thermosetting adhesive to bond the kenaf fibers. The resol-type phenolic resin adhesive can be prepared by the following steps. First, distilled phenol, formaldehyde aqueous solution and an alkali catalyst are weighed before they are put in a reaction vessel. Once put in the reaction vessel, which is heated in an oil bath, these reactants are stirred for reaction, after which an appropriate amount of sulfuric acid is added thereto to adjust the acidity and neutralize an excess alkali catalyst to precipitation. Next, an aspirator depressurizes the reaction vessel to vacuum evaporate water from the reactants leaving a phenolic resin aqueous solution having about 50 weight % non-volatile component (resin component). The phenolic resin aqueous solution prepared in this manner is used as an adhesive in the present invention.

Figure 3:
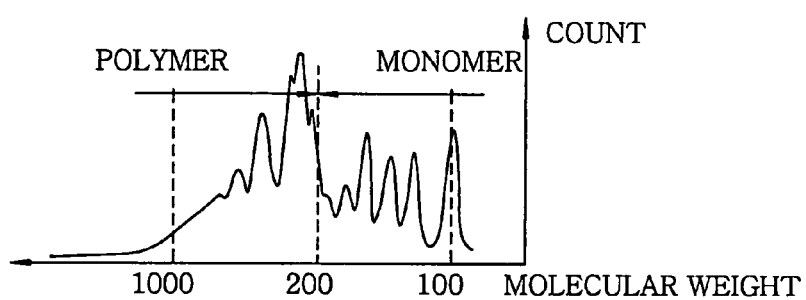
FIG. 3 represents a distribution of a phenolic resin in accordance with its molecular weight.

The alkali catalyst can be one selected from the group consisting of sodium hydroxide, calcium hydroxide, barium hydroxide, ammonia and amine. In general, the reaction temperature is about 60° C.~95° C. and the reaction time ranges from several tens of minutes to about 2 hours. The resol-type phenolic resin is a mixture of monomers and polymers, monomer and repeat unit for polymers being such as phenol, mono-methylol phenol, di-methylol phenol and tri-methylol phenol. Accordingly, the phenolic resin includes monomers having a molecular weight of about 90~200 and polymers having a molecular weight of about 180~2000. A molecular weight distribution of the phenolic resin is shown in FIG. 3. As previously shown, a molecular weight distribution of a phenolic resin can be controlled at will. A phenolic resin of a different molecular weight and viscosity can be obtained by changing the reaction conditions, the mole ratio between phenol and aldehyde, the alkali catalyst or the amount of the alkali catalyst.

Figure 2B:
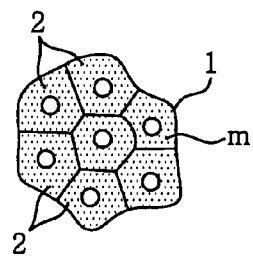
FIG. 2B provides a schematic diagram of a cross-sectional view of the kenaf fiber illustrating the phenolic resin monomers impregnated inside the kenaf fiber.
Figure 2C:
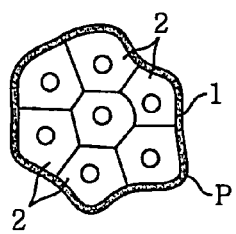
FIG. 2C offers a schematic diagram of a cross-sectional view of the kenaf fiber illustrating the phenolic resin polymers attached to the kenaf fiber.

In the present invention, a resin component in the phenolic resin adhesive is preferably of an average molecular weight of about 400~700 and includes about 10~40 weight % monomers of a molecular weight of about 90~200 and about 60~90 weight % polymers of a molecular weight of about 180~2000. (Weight % of the monomers and the polymers add up to 100 weight %.) With their small sizes, monomers may easily infiltrate into the inside of the kenaf fiber 1. As shown in FIG. 2B, monomers (m) are found to be infiltrating into the inside of the kenaf fiber 1 while polymers (p), due to their bigger sizes, mostly fail to do so and attach themselves to the outer surface of the kenaf fiber 1. Accordingly, phenolic resin monomers are cured inside the kenaf fiber 1 during the curing process. The cured phenolic resin monomers inside the kenaf fiber 1 prevent moisture from infiltrating into the inside of the kenaf fiber 1 when the fibrous layer 11 absorbs moisture, if any. Accordingly, swelling and warping of the kenaf fiber 1 is cut to a minimum and dimensional stability of the fibrous layer 11 can be secured. Polymers are cured on the outer surface of the kenaf fiber 1 to bond the kenaf fibers together, thereby raising the peeling strength of the fibrous layer 11. Through these steps, the fibrous layer 11 of a higher peeling strength and excellent dimensional stability can be obtained.

If the monomer content in the phenolic resin is below 10 weight % and the polymer content occupies more than 90 weight %, the amount of the resin infiltrating into the inside of the kenaf fiber 1 is so small that the dimensional stability may be at risk. On the other hand, if the amount of the monomer in the phenolic resin exceeds 40 weight % and the polymer content is less than 60 weight %, the amount of the resin attached to the outer surface of the kenaf fiber 1 is so small that the resulting fibrous layer 11 may lack in the peeling strength. Likewise, if an average molecular weight of the phenolic resin is less than 400, the amount of the resin attached to the outer surface of the kenaf fiber 1 is so small that the resulting fibrous layer 11 may lack in peeling strength. On the other hand, if an average molecular weight of the phenolic resin is more than 700, the amount of the resin infiltrating into the inside of the kenaf fiber 1 is so little that the benefit of dimensional stability would be lost. Accordingly, in order to achieve both goals of dimensional stability and high peeling strength, it is preferable that the weight % distribution between the monomers and the polymers, and the average molecular weight of the phenolic resin are to be controlled within the preferred ranges as specified above.

Figure 1:
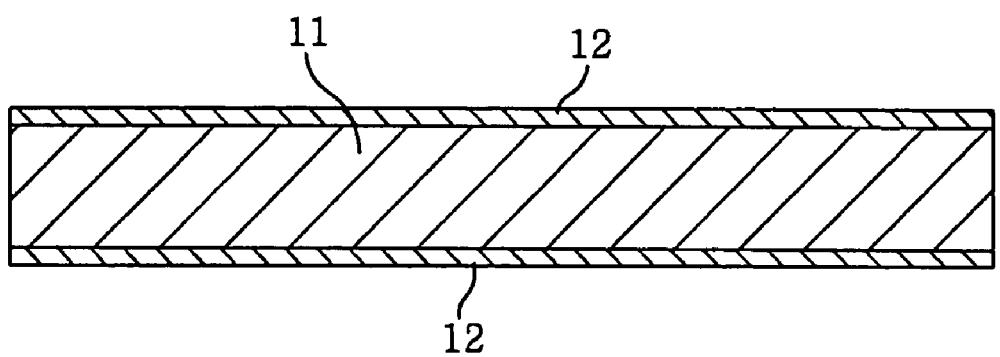
FIG. 1 shows a cross-sectional view of one aspect of the preferred embodiment of the present invention.

As shown in FIG. 1, the backup board for use in a machining process in accordance with the present invention is prepared by adhering and laminating at least one side of the fibrous layer 11 with a surface layer 12. The surface layer 12 may be prepared by the following steps. First, paper is impregnated with a thermosetting resin and dried into a prepreg. Next, the prepreg is cured under heat and pressure into the surface layer 12.

The thermosetting resin which may be employed in the present invention can be one generally used as a laminate in the art such as phenolic resin and melamine resin, but is not limited thereto. The thermosetting resin varnish is impregnated into paper. By heating and drying, the impregnated paper is half-cured into a B-stage resin paper (prepreg). The amount of the thermosetting resin impregnated in the resin paper is preferably about 40~60 weight % of the resin paper.

To adhere and laminate the surface layer 12 on the fibrous layer 11, the fibrous layer 11 is prepared in the same manner as shown in the above. Next, the resin paper is put on at least one side of the fibrous layer 11 before being processed under heat and pressure. Once subjected to heat and pressure, the thermosetting resin in the resin paper is cured to create the surface layer 12 at the same time as the surface layer 12 is adhered and laminated to the fibrous layer 11.

Lamination can also be accomplished in a different manner as follows. First, the fibrous mat is impregnated with a thermosetting adhesive in the same manner as previously described. After the impregnated fibrous mat is dried, the resin paper is put on at least one side of the dried impregnated fibrous mat before they are processed under heat and pressure. Once subjected to heat and pressure, the thermosetting resin in the resin paper and the thermosetting adhesive in the impregnated fibrous mat are cured to create the surface layer 12 and the fibrous layer 11, respectively. At the same time, the surface layer 12 and the fibrous layer 11 are adhered to each other. Curing conditions for manufacturing the surface layer 12 vary depending on the type of the thermosetting resin used and other factors. However, in general, it is preferable that the curing is done at a temperature of about 120° C.~190° C., under a pressure of about 1~4 MPa, and for a curing time of about 0.5~5 minutes.

When adhering and laminating the surface layer 12 on the fibrous layer 11 surface, the density of the surface layer 12 is preferably kept at about 1000~1500 kg/m$^3$ (specific gravity: about 1.0~1.5). If the density of the surface layer 12 is less than 1000 kg/m$^3$, the hardness of the surface layer 12 may be lost and it may not properly function as a burr keeper. On the other hand, if the density of the surface layer 12 is more than 1500 kg/m$^3$, the resulting backup board gets so heavy that the benefit of enhanced workability may be gone. Further, the high density of the surface layer 12 may cause an increased abrasion on the bits of the machining tools such as drill and router.

The surface layer 12 is preferably of about 0.05~0.3 mm in thickness. If the thickness of the surface layer 12 is less than 0.05 mm, the hardness of the surface layer 12 may not be sufficient for a burr keeper. On the other hand, if the thickness of the surface layer 12 is more than 0.3 mm, the resulting backup board gets so heavy that the benefit of enhanced workability may be lost. Further, the thick surface layer 12 may cause an increased abrasion on the bits of the machining tools such as drill and router.

Also, as previously shown, it is preferable that the surface layer 12 is controlled to have about 40~60 weight % resin by adjusting the thermosetting resin content in the resin paper. If the resin content in the surface layer 12 is less than 40 weight %, the surface layer 12 hardness can be lost and burrs may occur. On the other hand, if the resin content in the surface layer 12 exceeds 60 weight %, the resulting backup board gets so heavy that the benefit of the enhanced workability may be lost. Further, a high resin content in the surface layer 12 may cause an increased abrasion on the bits of the machining tools such as drill and router.

The backup board of the present invention prepared in accordance with the above-described steps is used to support the PCB either by applying it to the rear side of the PCB or by sandwiching the PCB with the backup boards. With hard and smooth surface of the surface layer 12, the backup board of the present invention may buttress the PCB during a drilling and/or routering process and prevent copper film from burring off. In addition, the backup board in accordance with the present invention has a core of light weighted fibrous layer 11 with a density of about 600~900 kg/m$^3$ (specific gravity: 0.6~0.9) limiting the hardness and smoothness to the surface layer 12, thereby reducing the overall material weight and enhancing workability. Moreover, even though drill bits and/or router of the processing tools cut inside the backup board, as the hard surface of the cured resin of the surface layer 12 is limited to the surface area; and the core is formed of the soft fibrous layer 11 made with kenaf fibers, the abrasion on the processing tools can be reduced. Furthermore, as the fibrous layer 11 is dimensionally stable when it absorbs moisture, a warp in the board rarely develops. This guarantees a secured support of the PCB during a machining process, thereby lowering the occurrences of burr.

Specific aspects of the present invention are further illustrated through the following Example, without limiting the scope thereof.

Example

Long fiber bundles (width: about 1~2 cm, length: about 2~4 m) obtained from the bast of the kenaf stem were mechanically fiberized until the average length and the average diameter of the kenaf fibers reached about 25 mm and about 100 μm, respectively. (The standard deviation in the fiber length was about 16 mm and that in the fiber diameter was about 41 μm.) Then, these kenaf fibers were piled up and needle-punched into a fibrous mat. After dipped in a phenolic resin adhesive, this fibrous mat was squeezed through a squeeze roller so that the content of the phenolic resin adhesive was adjusted to about 25 weight %. The phenolic resin adhesive used in the Example was a resol-type phenolic resin adhesive (resin component content: 50 weight %; pH 9.0; free-phenol content: 1.4 weight %; free-formaldehyde content: 0.06 weight %) having the average molecular weight of about 584 including the monomers of molecular weight of about 90~200 and the polymers of molecular weight of about 180~2000, the weight ratio of the monomers to the polymers being about 30:70.

Thereafter, the fibrous mat including the phenolic resin adhesive was dried at about 80° C. until its water content was lowered to about 10 weight %. Then, this fibrous mat was processed under heat and pressure, the process conditions being 170° C., 3 MPa and 4 minutes of process time, to obtain about 1.1 mm-thick kenaf fibrous layer 11. The density of the fibrous layer 11 was about 800 kg/m$^3$.

Meanwhile, paper with areal weight of about 110 g/m$^2$ was impregnated with the same phenolic resin as shown in the above before it was dried at about 80° C. for about 5 minutes to obtain the resin paper with 50 weight % resin impregnation.

Next, couple of resin paper pieces were applied to the above-described fibrous layer 11, disposing the fibrous layer 11 therebetween, before they were processed under heat and pressure. The process conditions were 165° C., 3 MPa and 3 minutes of process time whereby the surface layers B were adhered and laminated on both sides of the fibrous layer 11 to form the backup board 10. The surface layer 12 was about 0.2 mm in thickness and had a density of about 1300 kg/m$^3$. The resin content was equivalent to about 50 weight % of the surface layer. An overall density of the backup board 10 was about 960 kg/m$^3$.

Figure 4A:
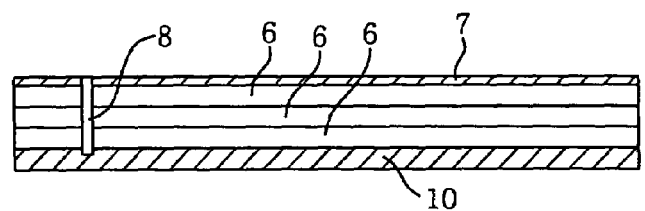
FIG. 4A depicts a cross-sectional view of a plate after drilling tested.
Figure 4B:
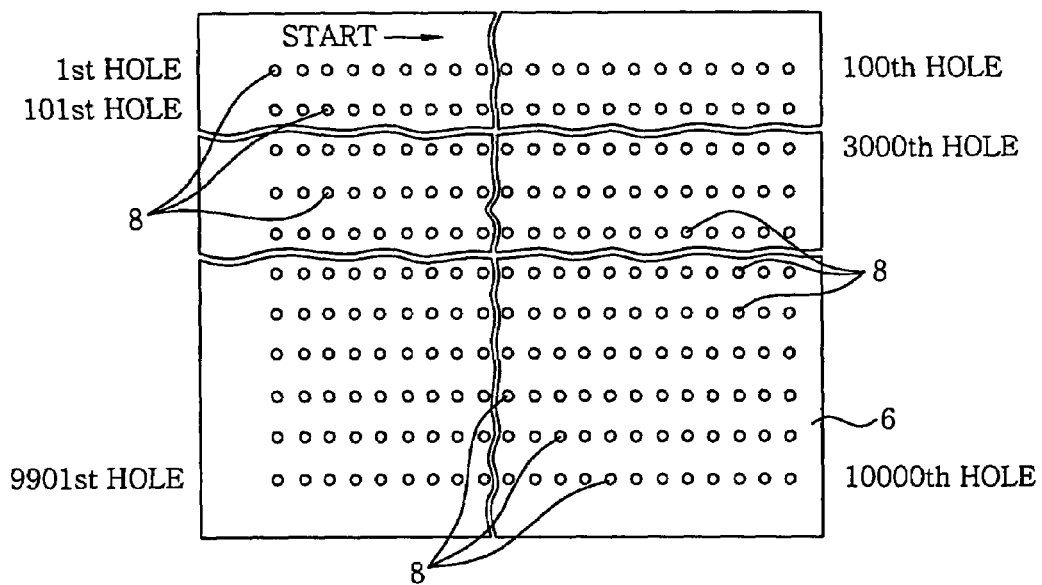
FIG. 4B presents a scaled front-view of the plate after drilling.

Using this backup board 10, a 1.6 mm-thick copper clad laminate 6 of phenolic resin impregnated paper was drilled. As shown in FIG. 4A, three sheets of copper clad laminate 6 were piled on the backup board 10 and 0.15 µm-thick aluminum foil 7 was put thereon before they were drilled with a drill bit (STX-33), having a diameter of 0.5 mm and a length of 8.5 mm. Aluminum foil 7 and three sheets of copper clad laminate 6 were penetrated until the drill end reached inside the backup board 10, with holes 8 in three sheets of copper clad laminate 6 formed at the same time. At the revolution rate of 67000 rpm and transporting velocity of 2000 mm/min, they were drilled in the following two steps. In the first step, the depth equivalent of one and half sheets of the copper clad laminate 6 was drilled. Next, in the second step, another depth equivalent to one and half sheets of the copper clad laminate 6 was drilled. As shown in FIG. 4B, 10000 holes 8 were drilled at about 2 mm pitch.

As a Comparative Example, SBT-K (thickness: 1.5 mm; density: 1400 kg/m$^3$) made by NIHON DECOLUXE CO., LTD. was used as a backup board and the above described steps in the Example were repeated to drill the copper clad laminate 6 of phenolic resin impregnated paper.

After 10000 holes 8 were drilled, edges of the drill bit were compared with those before drilling to measure the degree of drill bit abrasion. Results are shown in Table 1.

TABLE 1

|  | Abrasion |
| --- | --- |
| Example | About 18% |
| Comparative Example | About 22% |

As shown in Table 1, by using the backup board of the present invention, drill bit abrasion can be substantially reduced. Moreover, the backup board used in the Example, with its density of about 960 kg/m$^3$ (specific gravity: about 1), is lighter than that used in the Comparative Example by as much as 30%, the density of the latter being about 1400 kg/m$^3$ (specific gravity: about 1.4). Accordingly, the backup board of the present invention has an enhanced workability.

Further, the above-described steps given for the Example and the Comparative Example were repeated to drill a copper clad laminate 6 of epoxy resin impregnated glass using the backup boards of the Example and the Comparative Example. After 10000 holes 8 were drilled, edges of the drill bit were compared with those before the drilling to measure the degree of drill bit abrasion. For the 3,000$^{th}$ hole 8, burrs on a copper film were measured. Results are shown in Table 2.

TABLE 2

|  | Abrasion | Burrs |
| --- | --- | --- |
| Example | About 61% | About 30.6 µm |
| Comparative Example | About 62% | About 33.5 µm |

As shown in Table 2, by using the backup board of the present invention, drill bit abrasion and burrs are clearly reduced.

While the invention has been shown and described with respect to the preferred embodiments, it will be understood by those skilled in the art that various changes and modifications may be made without departing from the spirit and scope of the invention as defined in the following claims.

What is claimed is:

1. A method for machining a board, comprising:
   forming a backup board:
   supporting the board by the backup board; and
   machining the board while the board is supported by the backup board,
   wherein the backup board has a fibrous layer and a surface layer formed on one side of the fibrous layer, the surface layer being in contact with the board during said supporting the board and said machining the board, and
   wherein said forming the backup board includes:
   forming an impregnated fibrous mat by impregnating a thermosetting adhesive into a fibrous mat of the kenaf fibers, the kenaf fibers being adhered together by the thermosetting adhesive and having an average length of about 10-200 mm and an average diameter of about 10-300 µm;
   forming the fibrous layer having a density of about 600-900 kg/m$^3$ by curing the impregnated fibrous mat;
   forming a resin paper by impregnating a thermosetting resin into a paper; and
   forming the surface layer on said one side of the fibrous layer by curing the resin paper.

2. The method of claim 1, wherein the density of the surface layer is about 1000-1500 kg/m$^3$.

3. The method of claim 2, wherein the surface layer has a thickness of about 0.05-0.3 mm.

4. The method of claim 2, wherein the thermosetting resin occupies about 40-60 weight % of the surface layer.

5. The method of claim 2, wherein the thermosetting adhesive is a phenolic resin adhesive with average molecular weight of about 400-700 and including about 10-40 weight % monomers with a molecular weight of about 90-200 and about 60-90 weight % polymers with a molecular weight of about 180-2000.

6. The method of claim 2, wherein the average length and the average diameter of the kenaf fibers are about 15-80 mm and about 70-150 μm, respectively.

7. The method of claim 2, wherein the density of the fibrous layer is about 700-850 kg/m$^3$.

8. The method of claim 1, wherein the surface layer has a thickness of about 0.05-0.3 mm.

9. The method of claim 1, wherein the thermosetting resin occupies about 40-60 weight % of the surface layer.

10. The method of claim 1, wherein the thermosetting adhesive is a phenolic resin adhesive with average molecular weight of about 400-700 and including about 10-40 weight % monomers with a molecular weight of about 90-200 and about 60-90 weight % polymers with a molecular weight of about 180-2000.

11. The method of claim 1, wherein the average length and the average diameter of the kenaf fibers are about 15-80 mm and about 70-150 μm, respectively.

12. The method of claim 1, wherein the density of the fibrous layer is about 700-850 kg/m$^3$.

13. The method of claim 1, wherein said forming the surface layer is performed by laminating the resin paper on said one side of the fibrous layer and then subjecting the resin paper to heat and pressure to cure the thermosetting resin.

14. The method of claim 1, wherein an amount of the thermosetting adhesive is about 20-30 weight % of the impregnated fibrous mat on a dry basis.

15. The method of claim 1, wherein said curing the impregnated fibrous mat is performed at a temperature of about 120-190° C. and under a pressure of about 1-4 MPa.

16. The method of claim 1, wherein the fibrous layer has a thickness of about 1.0-1.5 mm.

17. The method of claim 1, wherein the kenaf fibers have a standard deviation in lengths of about 20 mm or less and a standard deviation in diameters of about 50 μm or less.

18. The method of claim 1, wherein said curing the resin paper is performed at a temperature of about 120-190° C. and under a pressure of about 1-4 MPa.

19. A method for machining a board, comprising:
  forming a backup hoard;
  supporting the board by the backup board; and
  machining the board while the board is supported by the backup board,
  wherein the backup board has a fibrous layer and a surface layer formed on one side of the fibrous layer, the surface layer being in contact with the board during said supporting the board and said machining the board, and
  wherein said forming the backup board includes:
  forming an impregnated fibrous mat by impregnating a thermosetting adhesive into a fibrous mat of the kenaf fibers, the kenaf fibers being adhered together by the thermosetting adhesive and having an average length of about 10-200 mm and an average diameter of about 10-300 μm;
  forming a resin paper by impregnating a thermosetting resin into a paper; and
  forming the fibrous layer having a density of about 600-900 kg/m$^3$ and the surface layer by laminating the resin paper on a side of the impregnated fibrous mat and then by subjecting the resin paper and the impregnated fibrous mat to heat and pressure to concurrently cure the thermosetting resin and the thermosetting adhesive.

20. The method of claim 19, wherein said curing the thermosetting resin and the thermosetting adhesive paper is performed at a temperature of about 120-190° C. and under a pressure of about 1-4 MPa.

* * * * *